(12) United States Patent
Crowley et al.

(10) Patent No.: US 6,459,147 B1
(45) Date of Patent: Oct. 1, 2002

(54) ATTACHING SEMICONDUCTOR DIES TO SUBSTRATES WITH CONDUCTIVE STRAPS

(75) Inventors: Sean T. Crowley, Phoenix; Blake A. Gillett, Gilbert, both of AZ (US); Philip S. Mauri, Cabuyao (PH); Ferdinand E. Belmonte, Santa Rosa (PH); Remigio V. Burro, Jr., San Pedro (PH); Victor M. Aquino, Jr., Conception (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/536,236

(22) Filed: Mar. 27, 2000

(51) Int. Cl.$^7$ .......................... H01L 23/48; H01L 23/52
(52) U.S. Cl. .................. 257/692; 257/666; 257/669; 257/690; 257/730; 257/693; 257/674; 361/772
(58) Field of Search .............................. 257/692, 730, 257/669, 735, 693, 675, 772, 773, 774, 666; 361/772

(56) References Cited

U.S. PATENT DOCUMENTS

| | | | |
|---|---|---|---|
| 4,189,342 A | 2/1980 | Kock | 156/656 |
| 4,546,374 A * | 10/1985 | Olsen et al. | 357/71 |
| 4,935,803 A * | 6/1990 | Kalfus et al. | 357/68 |
| 4,942,452 A * | 7/1990 | Kitano et al. | 357/68 |
| 5,218,231 A | 6/1993 | Kudo | 257/753 |
| 5,266,834 A | 11/1993 | Nishi et al. | 257/706 |
| 5,399,902 A * | 3/1995 | Bickford et al. | 257/659 |
| 5,477,160 A * | 12/1995 | Love | 324/755 |
| 5,544,412 A | 8/1996 | Romero et al. | 29/832 |
| 5,663,597 A * | 9/1997 | Nelson et al. | 257/734 |
| 5,665,996 A | 9/1997 | Williams et al. | 257/401 |
| 5,767,527 A * | 6/1998 | Yoneda et al. | 257/48 |
| 5,814,884 A | 9/1998 | Davis et al. | 257/723 |
| 6,040,626 A | 3/2000 | Cheah et al. | 257/735 |
| 6,127,727 A * | 10/2000 | Eytcheson | 257/692 |

(List continued on next page.)

FOREIGN PATENT DOCUMENTS

| | | | | |
|---|---|---|---|---|
| GB | 0720225 A2 | 12/1995 | | 23/482 |
| GB | 0720234 A2 | 7/1996 | | 29/417 |
| JP | 60-116239 | 8/1985 | | 21/60 |
| JP | 8-64634 | 3/1996 | | 21/60 |

OTHER PUBLICATIONS

Internet Website Article, Electronic Design—Mar. 22, 1999, vol. 47, No. 6– MOSFETs Break Out Of The Shackles Of Wirebonding.
File Wrapper for Provisional Patent Application No. 60/101810.
http://www.siliconix.com, "New Package Technology Yields Nearly Twofold Improvement Over Previous State-of-the-Art," Vishay Siliconix Press Release, Dec. 9, 1998.

*Primary Examiner*—Tom Thomas
*Assistant Examiner*—Nitin Parekh
(74) *Attorney, Agent, or Firm*—Skjerven Morrill LLP; James E. Parsons

(57) ABSTRACT

This invention provides a method apparatus for electrically connecting a semiconductor die, such as a power MOSFET, to a substrate on which the die is mounted, e.g., a lead frame, with a conductive strap, such that the connection is resistant to the shear stresses incident upon it with changes in temperature of the device. The method includes providing a conductive strap, and in one embodiment thereof, forming a recess in the top surface of the substrate. The bottom surface of a flange portion of the strap is attached to the floor of the recess such that the recess captures the flange and prevents relative horizontal movement of the flange and substrate with variations in the temperature of the device.

Other embodiments include attaching the strap to the die and substrate with joints of a resilient conductive elastomer, and forming apertures in the strap and substrate that cooperate with a conductive joint material to reinforce the connection against temperature-induced shear forces.

7 Claims, 4 Drawing Sheets

U.S. PATENT DOCUMENTS

| | | | |
|---|---|---|---|
| 6,144,093 A | 11/2000 | Davis et al. | 257/723 |
| 6,187,611 B1 | 2/2001 | Preston et al. | 438/106 |
| 6,223,429 B1 * | 5/2001 | Kaneda et al. | 29/832 |
| 6,249,041 B1 | 6/2001 | Kasem et al. | 257/666 |
| 6,252,300 B1 | 6/2001 | Hsuan et al. | 257/686 |
| 6,255,672 B1 | 7/2001 | Yoshioka et al. | 257/107 |
| 6,256,200 B1 | 7/2001 | Lam et al. | 361/704 |

* cited by examiner

ATTACHING SEMICONDUCTOR DIES TO SUBSTRATES WITH CONDUCTIVE STRAPS

BACKGROUND

1. Field of the Invention

This invention relates to packaging of semiconductor devices in general, and in particular, to a method and apparatus for reliably connecting the die of a high power device, such as a power MOSFET device, to its associated substrate with a conductive strap.

2. Description of the Related Art

Some high power semiconductor devices are fabricated by forming a number of individual, lower power devices in a single semiconductor die, or "chip," then "paralleling" them, i.e., connecting the individual devices together in parallel within the package of the device to define a single device capable of higher power output.

Thus, in an exemplary eight-lead, standard outline integrated circuit ("SOIC-8") high-power, metal-oxide-semiconductor field effect transistor ("PMOSFET") package, the sources of the individual devices, which are located on the top of the die, are connected in parallel by a thin layer of metal on the top of the die, which in turn, is internally connected to each of three leads of the package.

In prior art versions of this type of device, the sources of the individual MOSFETs were connected to the substrate of the package by a relatively large number (typically, 14) of parallel bonded wires. However, these wires contributed to a number of problems associated with this type of device, including relatively high internal thermal and electrical resistances, high parasitic source-inductance, and the formation of craters and Kirkendall voids in the die caused by the bonding of the wires.

More recently, it has been learned that most of the foregoing problems can be eliminated or reduced by replacing the large number of bonded wires from the source of the device with a single, elongated conductive strap that connects the thin layer of metal on top of the die to the source leads of the substrate. (See, e.g., U.S. Pat. No. 6,040,626 to C. Cheah, et al.; see also, Patrick Manion, "MOSFETs Break Out Of The Shackles of Wirebonding," *Electronic Design*, Mar. 22, 1999, Vol. 47,No.6.)

However, this method of connecting the die to the substrate has also been found to have some problems associated with it. One of these relates to the differences in the respective thermal coefficients expansion ("TCE") of the materials of the strap, die, and substrate. As a result of these differences, these parts respectively experience different amounts of expansion and contraction with changes in the temperature of the package. This relative movement of the respective parts causes large shear stresses to develop in the attachment joints between them, which are typically lap joints of conductive adhesive or solder. These shear stresses result in a degradation of the electrical connection between the strap, die, and substrate, and in particular, in an unacceptably large change, or "shift," in the critical drain-to-source resistance of the device when on ($R_{DS(ON)}$).

A need therefore exists for a method and apparatus for reliably connecting a semiconductor die to a substrate with a conductive strap such that the electrical connections between the parts are immune to the destructive effects of temperature-induced stresses in the connections.

SUMMARY OF THE INVENTION

This invention provides a method and apparatus for electrically connecting a semiconductor die, such as a power MOSFET, to a substrate on which the die is mounted, e.g., a lead frame, with a conductive strap, such that the connection is more resistant to the shear stresses incident upon it with changes in temperature of the device. The enhanced reliability of this connection, in turn, enhances overall device reliability and reduces semiconductor package failures due to, e.g., large changes in the device's $R_{DS(ON)}$ parameter.

The method includes the provision of a conductive strap comprising a planar cover portion having a bottom surface adapted for attachment to a top surface of the die, a down-set portion at an edge of the cover portion that transitions from the cover portion of the strap down to the substrate, and a flange portion at an edge of the down-set portion which has a bottom surface adapted for attachment to the substrate.

In one exemplary embodiment of the method, a recess is formed in the top surface of the substrate. The recess has a floor disposed below the top surface of the substrate. The bottom surface of the cover portion of the strap is attached to the top surface of the die, e.g., with a conductive adhesive, and the bottom surface of the flange portion of the strap is attached to the floor of the recess such that the recess captures the flange and prevents horizontal movement of the flange relative to the substrate with variations in device temperature.

In another embodiment of the method, first and second layers of a conductive elastomer are attached to the top surfaces of the die and the substrate, respectively. The bottom surface of the cover portion of the strap is attached to a top surface of the first layer of elastomer on the die, and the bottom surface of the flange portion of the strap is attached to a top surface of the second layer of elastomer on the substrate. This flexible connection enables the strap, die, and substrate to move freely relative to one another with large changes in device temperature while remaining reliably connected to each other.

In a third exemplary embodiment of the method, a first set of corresponding apertures is formed through respective ones of the flange portion of the strap and the substrate, and a second set of apertures is formed through the cover portion of the strap. With the corresponding apertures in the flange and the substrate in alignment with each other, the bottom surfaces of the cover and flange portions of the strap are then attached to respective ones of the top surfaces of the die and the substrate with, e.g., a conductive adhesive. The adhesive extends through the apertures in the strap and the substrate to form interlocking "keys" therein. When cured, these adhesive keys provide a much greater resistance to the shear forces induced in the connection between the strap, substrate and die by large temperature excursions in the package than do the simple lap joints of the prior art.

A better understanding of the above and other features and advantages of the present invention may be obtained from a consideration of the detailed description of its exemplary embodiments found below, particularly if such consideration is made in conjunction with the several views of the drawings appended hereto.

DETAILED DESCRIPTION OF THE EXEMPLARY EMBODIMENTS

Figure 1:
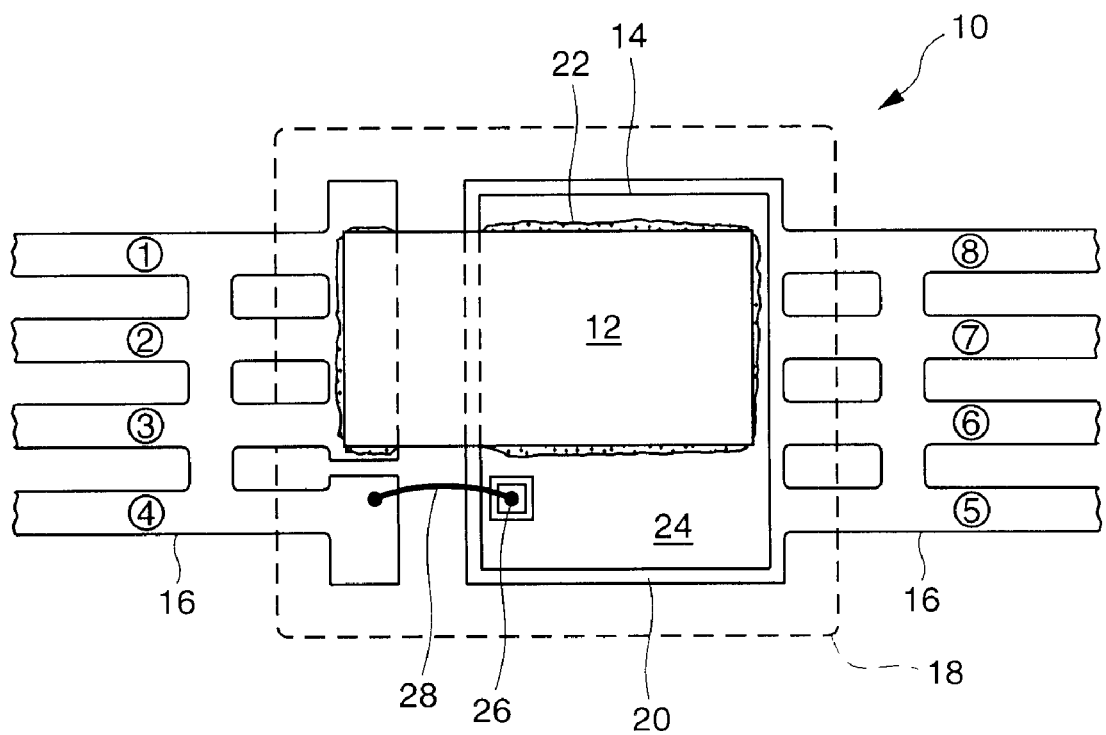
FIGS. 1 and 2 are top plan and side elevation views, respectively, of a lead frame type of power MOSFET semiconductor package having a conductive strap electrically connecting the die to the substrate in accordance with the prior art.
Figure 2:
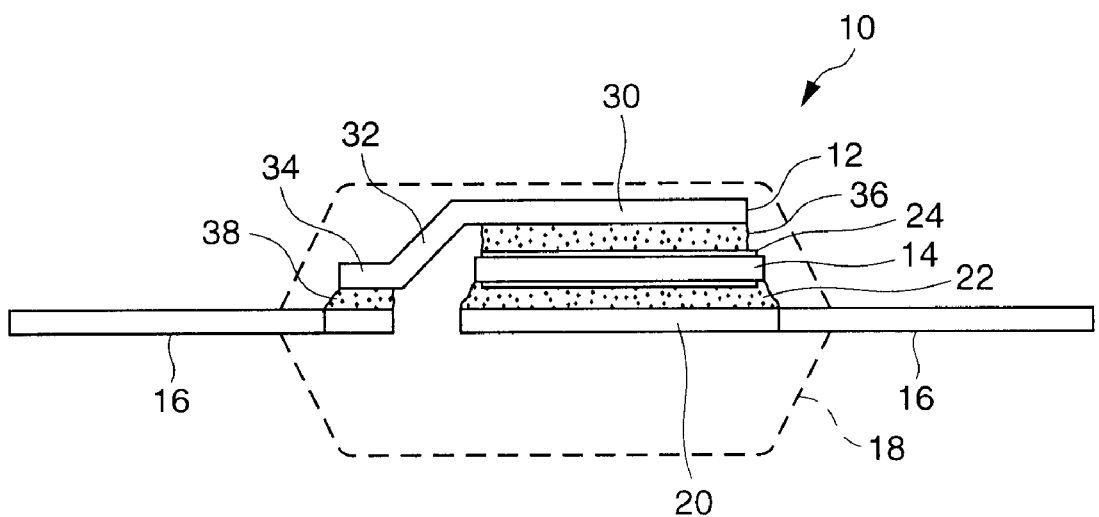

FIGS. 1 and 2 are top plan and side elevation views, respectively, of a eight-lead, lead frame-type of power MOSFET semiconductor package 10 having a conductive strap 12 electrically connecting the die 14 of the package to the substrate 16 thereof in accordance with the lap-joint strap attachment method of the prior art. The protective plastic body 18 of the package 10 is shown in dotted outline to reveal the components therein.

In the exemplary PMOSFET device of FIG. 2, the die 14 is attached to the die paddle 20 of the lead frame 16 by a layer of solder or conductive adhesive 22. This conductive layer also serves to connect the drains of a plurality of individual MOSFETs (not visualized), located on the bottom surface of the die 14, to each other and to the die paddle 20. The die paddle 20, in turn, is internally connected within the lead frame 16 to each of four leads (leads 5–8) of the package 10.

The sources of the individual MOSFETS, which are located on the top surface of the die 14, are connected to each other by a thin layer of metal 24 (see FIG. 2) on the top surface of the die. The metal layer 24, in turn, is connected to each of three leads (leads 1–3) of the package by the conductive strap 12. The gates of the individual MOSFETS are connected together within the die 14 and to a single pad 26 located on the top surface of the die 14. The pad 26, in turn, is connected to one of the leads (lead 4) of the package 10 by a bonded wire 28 (FIG. 1).

The conductive strap 12, which is typically formed from a sheet of copper or an alloy thereof, comprises a planar, cover portion 30 that has a bottom surface adapted to attach to the top surface of the die 14, a down-set portion 32 formed at an edge of the cover portion that transitions laterally downward from the cover portion to the level of the substrate 16, and a flange portion 34 formed at the lower edge of the down-set portion that has a bottom surface adapted to attach to the substrate. As shown in FIG. 2, the respective bottom surfaces of the cover and flange portions 30, 34 of the strap 12 lap over the respective top surfaces of the die 14 and the substrate 16, and are respectively joined thereto with layers 36, 38, respectively, of solder or a conductive epoxy.

In an alternative embodiment of the PMOSFET device (not illustrated), the substrate 16 may comprise a laminated substrate, such as a multi-layer printed circuit board ("PCB"), formed of layers of, e.g., epoxy-impregnated fiberglass and copper, with etched conductive traces replacing the leads of the lead frame substrate 16 illustrated in the figures.

Regardless of the type of substrate 16 in the package 10, however, it will be understood that the strap 12, die 14, and substrate 16, being fabricated from different materials, necessarily have different TCEs, which results in large differences in the amount of expansion and contraction undergone by the respective parts with changes in their temperature. As discussed above, this movement of the parts relative to one another with changes in temperature imparts large horizontal shear stresses in the lap joints 36 and 38 between the conductive strap 12 and respective ones of the die 14 and the substrate 16, and frequently leads to a degradation or failure of the electrical connection between the strap, the die, and/or the substrate.

Figure 3:
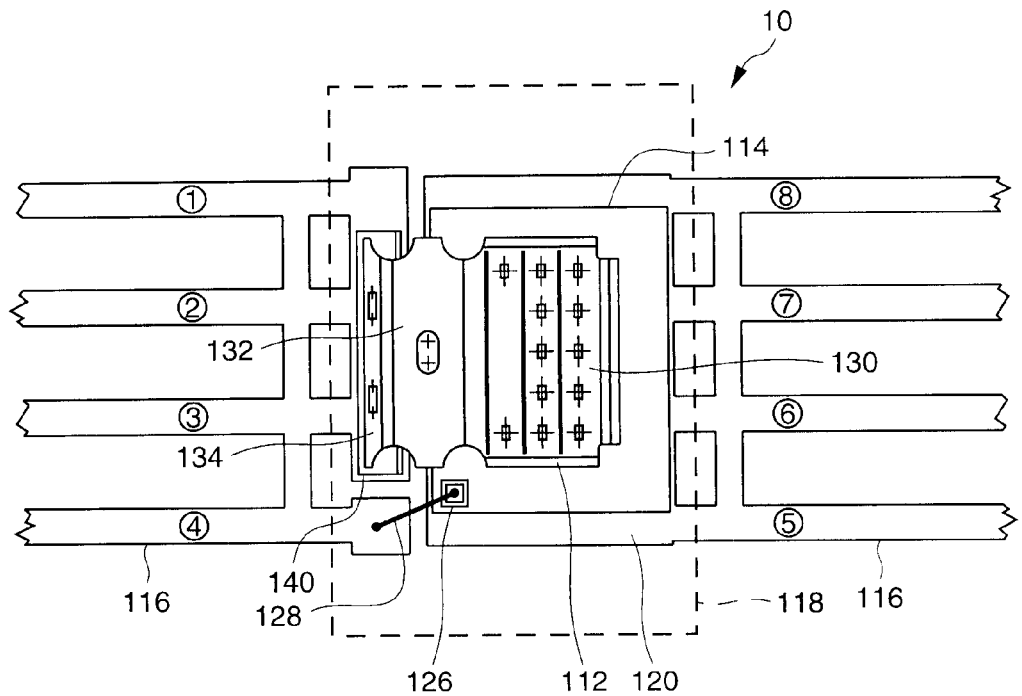
FIGS. 3 and 4 are top plan and side elevation views, respectively, of a semiconductor package having a conductive strap electrically connecting a die to a substrate in accordance with one exemplary embodiment of the present invention.
Figure 4:
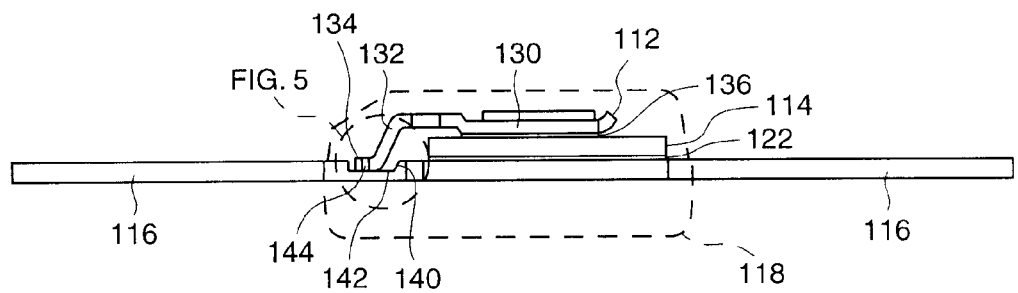

A first exemplary embodiment of a method and apparatus for overcoming the foregoing temperature-induced stress problem is illustrated in the top plan and side elevation views of a SOIC-8 PMOSFET package 110 shown in FIGS. 3 and 4, respectively, wherein elements similar to those in FIGS. 1 and 2 are numbered similarly, plus 100.

Figure 5:
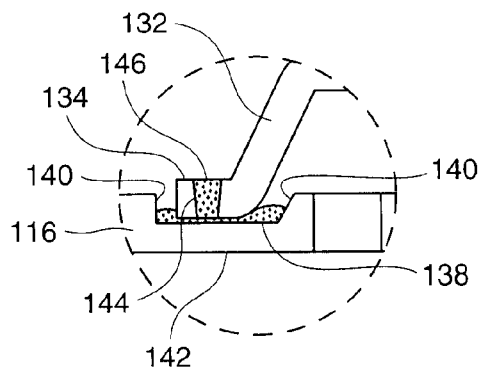
FIG. 5 is an enlarged view of the circled portion V in FIG. 4.

As shown in the circled portion V in FIG. 4, the first embodiment comprisses forming a recess 140 in the top surface of the substrate 116. As shown in the enlarged view of the circled portion V in FIG. 5, the recess 140 has an area slightly larger than that of the flange portion 134 of the conductive strap 112, and a floor 142 disposed below the top surface of the substrate 116. The flange portion 134 of the strap 112 is inserted into the recess 140, and its bottom surface is attached to the floor 142 of the recess by, e.g., a joint 138 of eutectic solder or a conductive adhesive, such as a silver-filled epoxy resin or elastomer. The recess 140 thus mechanically captivates the flange portion 134 of the conductive strap 112 so that horizontal movement of the flange portion relative to the substrate 116, such as would occur with a large changes in temperature of the parts, is prevented, thereby relieving the shear stresses acting on the connection joint 138.

As described below in connection with another embodiment of the invention, the resistance of the joint 138 to shear stresses can be further enhanced by forming slots, or apertures 144, through the flange portion of the strap such that the adhesive or solder of the attachment joint 138 flows into the apertures and forms mechanically interlocking "keys" 146 therein when it solidifies. The apertures 144 can be formed to taper toward the bottom surface of the flange portion 134 to enhance this interlocking effect of the keys 146.

Both the recess 140 in the substrate 116, and the optional apertures 144 of the connection strap 112, can be formed with a wide variety of known techniques, including photo-etching, electrical-discharge machining ("EDM"), stamping, punching, coining, or laser-burning.

Figure 6:
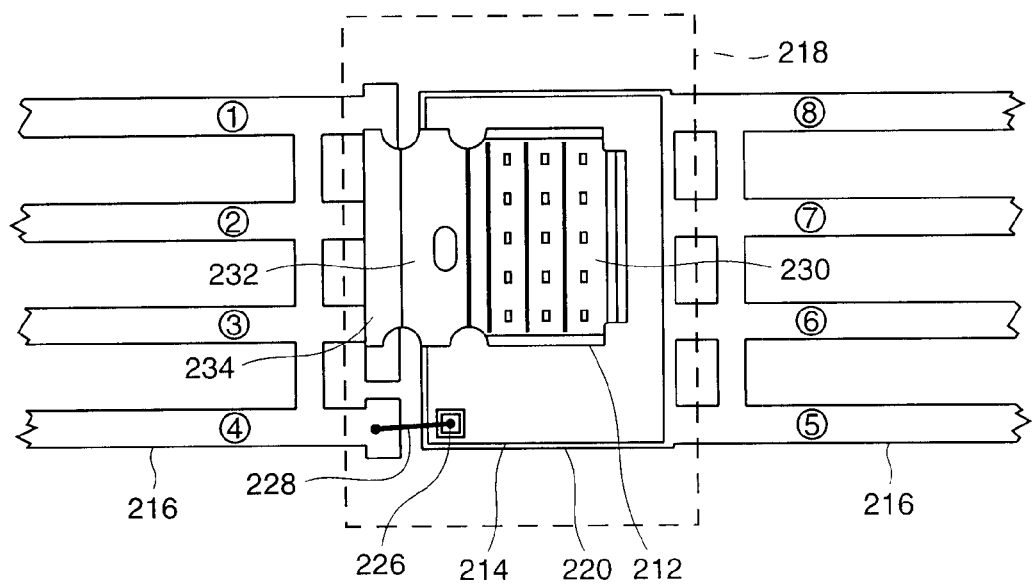
FIGS. 6 and 7 are top plan and side elevation views, respectively, of a semiconductor package having a conductive strap electrically connecting the die to the substrate in accordance with another embodiment of the present invention.
Figure 7:
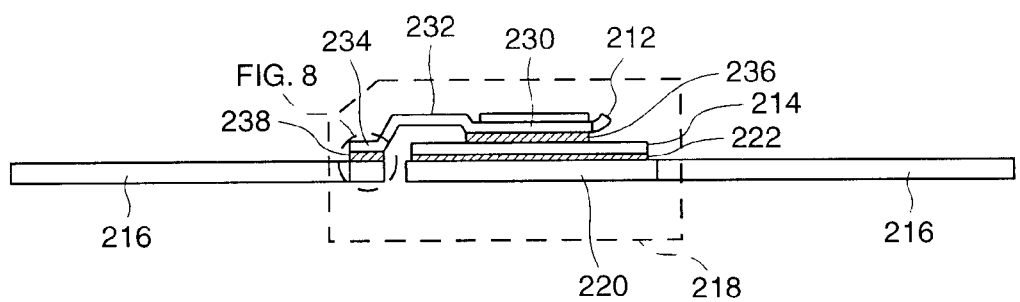

A second exemplary embodiment of a method for connecting a semiconductor die 214 to a planar substrate 216 while avoiding the temperature-induced stress problem in the connection is illustrated in the top plan and side elevation views of a SOIC-8 PMOSFET package 210 shown in FIGS. 6 and 7, respectively, wherein elements similar to those in FIGS. 3 and 4 are numbered similarly, plus 100.

Figure 8:
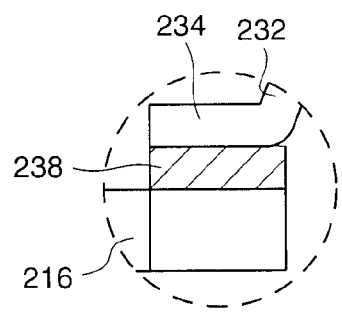
FIG. 8 is an enlarged view of the circled portion VIII in FIG. 7.

In the second exemplary embodiment, first and second layers of a high-electrically-conductive elastomer 236 and 238 are attached to the respective top surfaces of the die 214 and the substrate 216. The bottom surface of the cover portion 230 of the strap 212 is attached to the top surface of the first layer 236 of elastomer on the die 214, and the bottom surface of the flange portion 234 of the strap 212 is attached to the top surface of the second layer 238 of elastomer on the substrate 216. The detail of the latter joint 238 is shown enclosed in the circled portion VIII in FIG. 7, and an enlarged view thereof is shown in FIG. 8.

The conductive elastomer layers 236 and 238, which may comprise a silicone rubber filled with silver micro-spheres, thus define a pair of resiliently flexible connection joints between the strap 212, the die 214, and the substrate 216 that merely stretch in response to incident temperature-induced shear stresses. As a result, the strap 212, the die 214 and the substrate 216 are all free to move relative to one another while remaining firmly connected to each other electrically. This freedom of relative movement of the parts can be further enhanced by attaching a third layer 222 of a conductive elastomer to the top surface of the substrate 216, e.g., to the die paddle 220 of the lead frame illustrated, and then attaching the bottom surface of the die 214 to the top surface of the third elastomer layer.

The elastomer connection joints, or layers 222, 236 and 238, can be formed in a variety of ways. In one embodiment that can be effected with automated pickand-place equipment, a conductive elastomer compound in the form of an uncured, viscous fluid, is applied by a dispenser to one of the two surfaces of each of the three pairs of corresponding interfacial surfaces of the strap 212, the die 214, and the substrate 216, respectively. The other corresponding interfacial surfaces of the respective parts are then brought into respective contact with the uncured compound, which is then cured to solidify it and adhere the respective parts in electrical connection with each other.

In another embodiment, the elastomer connection layers 222, 236 and 238 can be provided in the form of cured strips that are simply adhered to the respective interfacial surfaces of the strap 212, die 214 and substrate 216 with, e.g., a conductive epoxy resin.

In yet another embodiment, the elastomer layers 222, 236 and 238 can be provided in the form of cured strips, as above. However, rather than bonding the strips to the respective interfacial surfaces of the strap 212, die 214 and substrate 216 with a conductive adhesive, the latter parts are instead heated, e.g., with an ultrasonic bonder that heats the parts by "scrubbing" them with a finger vibrated at ultrasonic frequencies, and then brought into contact with the surface of the elastomer strips, causing the surfaces of the strips to melt. The molten elastomer of the strips is then cooled, causing it to adhere to the respective interfacial surfaces of the strap 212, die 214, and substrate 216, and thereby connect them together with resilient, electrically conductive joints.

Figure 9:
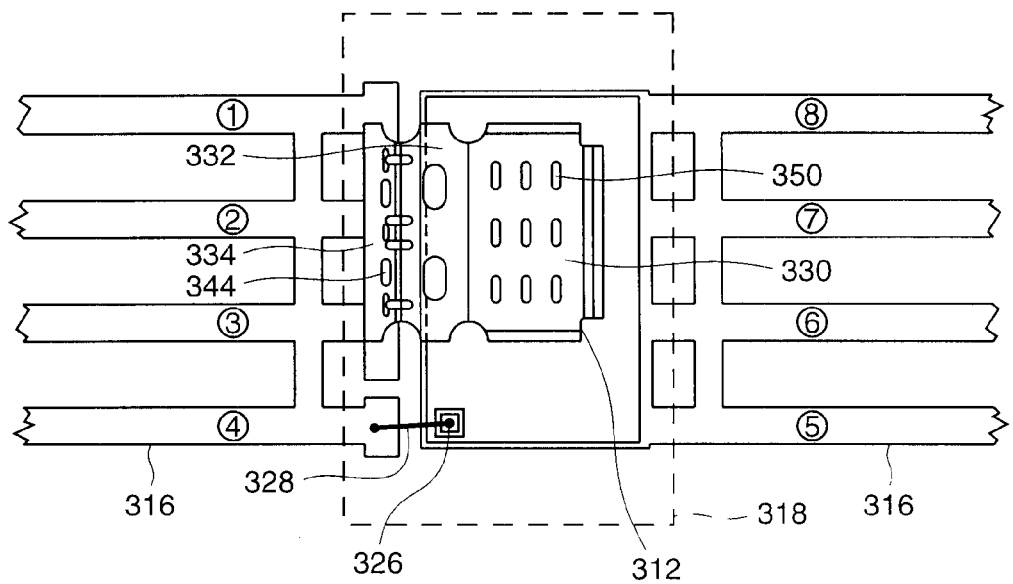
FIGS. 9 and 10 are top plan and side elevation views, respectively, of a semiconductor package having a conductive strap electrically connecting the die to the substrate in accordance with another embodiment of the present invention; and, FIG. 11 is an enlarged view of the circled portion XI in FIG. 10.
Figure 10:
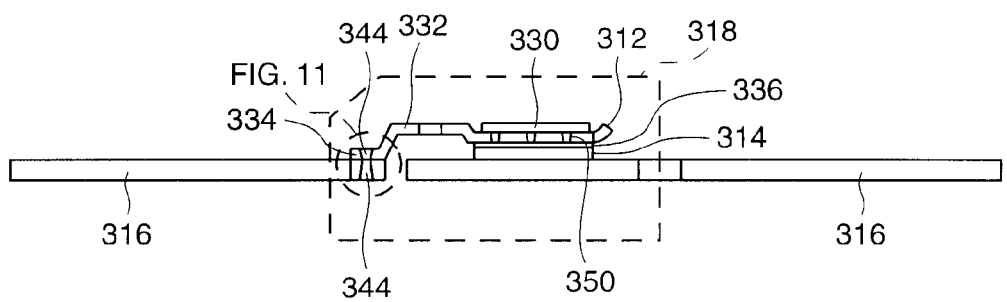

A third exemplary embodiment of a method and apparatus for connecting a semiconductor die 314 to a planar substrate 316 while avoiding a temperature-induced stress problem in the connection is illustrated in the top plan and side elevation views of the SOIC-8 PMOSFET package 310 shown in FIGS. 9 and 10, respectively, wherein elements similar to those in FIGS. 6 and 7 are numbered similarly, plus 100.

The third exemplary embodiment comprises forming pairs of corresponding apertures 344 through respective ones of the flange portion 334 of the strap 312 and the substrate 316, and forming a second set of single apertures 350 through the cover portion 330 of the connection strap 312. The bottom surface of the cover portion 330 of the strap 312 is then attached to the top surface of the die 314, and the bottom surface of the flange portion 334 of the strap 312 is attached to the top surface of the substrate 316 with a joint 338 of an electrically conductive material, such that respective ones of the first set of corresponding apertures are aligned with each other, and such that the conductive material of the joint 338 flows into each of the apertures 344, 350 in the respective two sets thereof and forms an interlocking key 346 therein when it is cured.

Figure 11:
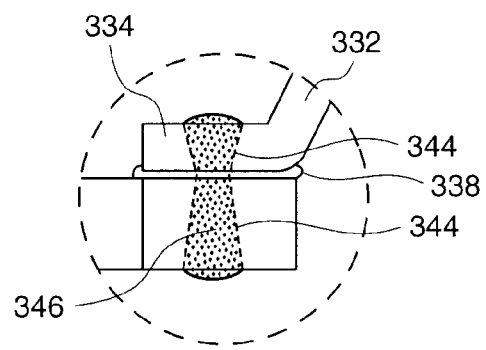

A pair of the first set of corresponding apertures 344 and their associated interlocking key 346 are shown in the circled portion XI in FIG. 10, and in the enlarged view thereof in FIG. 11. As shown in FIG. 11, and described above in connection with the first embodiment, the mechanical resistance of the connection joint 338 between the strap 312 and the substrate 316 to temperature-induced shear stresses can be further enhanced by tapering respective ones of the first set of corresponding apertures 344 toward the bottom surface of the flange portion and the top surface of the substrate, respectively. Similarly, the mechanical resistance of the connection joint 336 between the strap 312 and the die 314 to temperature-induced shear stresses can be further enhanced by tapering the second set of apertures 350 toward the bottom surface of the cover portion 330 of the strap.

The apertures 344, 350 can be circular, or elongated slots, as illustrated in the figures. They can be formed by a variety of methods, e.g., by photo-etching, EDM, punching, stamping, or ablative laser-burning. In the case of an etched metal lead frame type of substrate 316 such as that shown in the figures, the apertures 344, 350 can be efficiently etched at the same time the lead frame is etched from the parent stock. Further, the bond strength of the plastic body 318 molded on the package 310 can be enhanced by roughening the surfaces of the strap 312 and the substrate 316, which can also be effected by an etching process.

Indeed, those of skill in the art will recognize that many variations and modifications can be made in the materials and methods of this invention without departing from its true scope and spirit. Accordingly, the scope of the invention should not be limited to that of the particular embodiments illustrated and described herein, as they are merely exemplary in nature, but rather, should encompass that of the claims appended hereafter.

What is claimed is:

1. A semiconductor package, comprising:
   a substrate having a top surface with central die-mounting region and a first set of apertures therethrough adjacent to the die-mounting region;
   a semiconductor die having a top surface and an opposite bottom surface mounted on the die-mounting region of the substrate; and,
   an electrically conductive strap that includes:
   a planar cover portion having a bottom surface attached to the top surface of the die with a first electrically conductive material,
   a down-set portion at an edge of the cover portion that transitions from the cover portion to the substrate, and
   an elongated flange portion at an edge of the down-set portion having a set of apertures therethrough corresponding to the first set of apertures in the substrate and a bottom surface attached to the substrate with a second electrically conductive material such that corresponding apertures in the substrate and the flange portion are in respective alignment with each other, and such that the material of the second electrically conductive material flows into each of the apertures and forms an interlocking key therein.

2. The semiconductor package of claim 1, wherein at least one of the first and second electrically conductive materials comprises solder, an electrically conductive adhesive, or an electrically conductive elastomer.

3. The semiconductor package of claim 1, wherein respective ones of the first set of corresponding apertures in the substrate and the flange portion are tapered toward the bottom surface of the second portion of the strap and the top surface of the substrate, respectively.

4. The semiconductor package of claim 1, wherein the cover portion of the strap includes a second set of apertures therethrough, and wherein the first electrically conductive material flows into each of the apertures and forms an interlocking key therein.

5. The semiconductor package of claim 4, wherein each of the second set of apertures is tapered toward the bottom surface of the cover portion.

6. The semiconductor package of claim 1, wherein the semiconductor die is a power MOSFET.

7. The semiconductor package of claim 1, wherein the substrate has an opening extending through the top surface and at least partially through a thickness of the substrate, and the flange portion is disposed within the opening.

\* \* \* \* \*